(12) United States Patent
Shi et al.

(10) Patent No.: US 8,611,637 B2
(45) Date of Patent: Dec. 17, 2013

(54) WAFER PLANE DETECTION OF LITHOGRAPHICALLY SIGNIFICANT CONTAMINATION PHOTOMASK DEFECTS

(75) Inventors: Ruifang Shi, Cupertino, CA (US); Yalin Xiong, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 478 days.

(21) Appl. No.: 12/871,813

(22) Filed: Aug. 30, 2010

(65) Prior Publication Data

US 2011/0299758 A1 Dec. 8, 2011

Related U.S. Application Data

(63) Continuation-in-part of application No. 11/622,432, filed on Jan. 11, 2007, now Pat. No. 7,873,204.

(51) Int. Cl.
*G06K 9/00* (2006.01)
(52) U.S. Cl.
USPC .......................................................... 382/144
(58) Field of Classification Search
USPC ........... 382/144–151; 438/5–13; 348/87, 126; 356/237.4, 237.5; 250/559.39–559.49; 702/40, 82
See application file for complete search history.

(56) References Cited

U.S. PATENT DOCUMENTS

| 6,577,994 | B1 | 6/2003 | Tsukuda |
| 7,440,093 | B1 | 10/2008 | Xiong et al. |
| 2002/0152452 | A1 | 10/2002 | Socha |
| 2002/0192578 | A1 | 12/2002 | Tanaka et al. |
| 2003/0082463 | A1 | 5/2003 | Laidig et al. |
| 2004/0052411 | A1 | 3/2004 | Qian et al. |
| 2004/0228515 | A1 | 11/2004 | Okabe et al. |
| 2004/0243320 | A1 | 12/2004 | Chang et al. |
| 2005/0210437 | A1 | 9/2005 | Shi et al. |
| 2006/0270072 | A1 | 11/2006 | Ikenaga et al. |
| 2007/0058852 | A1 | 3/2007 | Pang |
| 2008/0163140 | A1 * | 7/2008 | Fouquet et al. ................... 716/4 |

(Continued)

FOREIGN PATENT DOCUMENTS

| JP | 08-137092 | 5/1996 |
| JP | 2002-328462 | 11/2002 |
| JP | 2003-207459 | 7/2003 |
| JP | 2006-330269 | 12/2006 |

OTHER PUBLICATIONS

International Search Report and Written Opinion dated Apr. 9, 2012, issued in International Application No. PCT/US2011/049739.

(Continued)

*Primary Examiner* — Samir Ahmed
(74) *Attorney, Agent, or Firm* — Kwan & Olynick LLP

(57) ABSTRACT

Provided are novel methods and systems for inspecting photomasks to identify lithographically significant contamination defects. Inspection may be performed without a separate reference image provided from a database or another die. Inspection techniques described herein involve capturing one or more test images of a photomask and constructing corresponding test "simulation" images using specific lithographic and/or resist models. These test simulation images simulate printable and/or resist patterns of the inspected photomask. Furthermore, the initial test images are used in parallel operations to generate "synthetic" images. These images represent a defect-free photomask pattern. The synthetic images are then used for generating reference simulation images, which are similar to the test simulation images but are free from lithographically significant contamination defects. Finally, the reference simulation images are compared to the test simulation images to identify the lithographically significant contamination defects on the photomask.

21 Claims, 2 Drawing Sheets

(56) References Cited

U.S. PATENT DOCUMENTS

| | | | |
|---|---|---|---|
| 2008/0170773 A1* | 7/2008 | Wihl et al. | 382/144 |
| 2010/0141925 A1* | 6/2010 | Cao et al. | 355/77 |
| 2011/0116067 A1* | 5/2011 | Ye et al. | 355/67 |
| 2011/0224956 A1* | 9/2011 | Ye et al. | 703/1 |
| 2012/0253774 A1* | 10/2012 | Ye et al. | 703/13 |
| 2012/0269421 A1* | 10/2012 | Ye et al. | 382/144 |

OTHER PUBLICATIONS

Gallagher et al, "SMO Photomask Inspection in the Lithographic Plane", Photomask Technology 2009, Proc. of SPIE vol. 7488 748807-1.

Wihl et al., U.S. Application entitled "Method for Detecting Lithographically Significant Defects on Reticles", filed Jan. 11, 2007, U.S. Appl. No. 11/622,432.

Shi et al., U.S. Application entitled "Reticle Defect Inspection with Model-Based Thin Line Approaches", filed Aug. 30, 2010, U.S. Appl. No. 12/871,821.

Kikuiri et al., "Development of Advanced Reticle Inspection Apparatus for Hp 65 Nm Node Device and Beyond", Photomask and Next-Generation Lithography Mask Technology XIII. Edited by Hoga, Morihisa. Proceedings of the SPIE, vol. 6283, pp. 62830Y (2006).

International Search Report and Written Opinion for PCT Application PCT/US2008/050914, dated Jul. 14, 2009.

U.S. Office Action for U.S. Appl. No. 11/622,432 mailed Mar. 11, 2010.

U.S. Notice of Allowance for U.S. Appl. No. 11/622,432 mailed Jul. 20, 2010.

Japanese Application Serial No. 2009545713, Office Action mailed Jul. 31, 2012, 12 pgs.

* cited by examiner

WAFER PLANE DETECTION OF LITHOGRAPHICALLY SIGNIFICANT CONTAMINATION PHOTOMASK DEFECTS

CROSS-REFERENCE TO RELATED APPLICATIONS

This application is a Continuation-in-Part application of U.S. patent application Ser. No. 11/622,432, entitled "METHOD FOR DETECTING LITHOGRAPHICALLY SIGNIFICANT DEFECTS ON RETICLES," filed on Jan. 11, 2007, to Wihl et al., which is incorporated herein by reference in its entirety for all purposes.

BACKGROUND

As densities and complexities of integrated circuits (ICs) continue to increase, inspecting photomask patterns become progressively more challenging. Every new generation of ICs has denser and more complex patterns that currently reach and exceed optical limitations of lithographic systems. To overcome these limitations, various Resolution Enhancement Techniques (RET), such as Optical Proximity Correction (OPC), have been introduced. For example, OPC helps to overcome some diffraction limitations by modifying photomask patterns such that the resulting printed patterns correspond to the original desired patterns. Such modifications can include perturbations to sizes and edges of main IC features, i.e., printable features. Other modifications involve additions of serifs to pattern corners and/or providing nearby sub-resolution assist features (SRAFs), which are not expected to result in printed features and, therefore, are referred to as non-printable features. These non-printable features are expected to cancel pattern perturbations that would otherwise have occurred during the printing process.

Adding non-printable features to a mask having a dense population of printable features further complicates photomask inspection. Furthermore, non-printable and printable features have different impacts on the printed pattern. As such, defects corresponding to these features will have different lithographical significance, and some of the defects can be ignored during inspection.

SUMMARY

Provided are novel methods and systems for inspecting photomasks to identify lithographically significant contamination defects. Inspection may be performed without a separate reference image provided from a database or another die. Inspection techniques described herein involve capturing one or more test images of a photomask and constructing corresponding test "simulation" images using specific lithographic and/or resist models. These test simulation images simulate printable and/or resist patterns of the inspected photomask. Furthermore, the initial test images are used in parallel operations to generate "synthetic" images. These images represent a defect-free photomask pattern. The synthetic images are then used for generating reference simulation images, which are similar to the test simulation images but are free from lithographically significant contamination defects. Finally, the reference simulation images are compared to the test simulation images to identify the lithographically significant contamination defects on the photomask.

In certain embodiments, a method for inspecting a photomask to identify lithographically significant contamination defects involves providing the photomask having one or more printable features and one or more non-printable features, producing a test transmission and test reflection images, and constructing test simulation images by applying a lithography system model to the test images. One example of non-printable features includes sub-resolution assist features (SRAF). In certain embodiments, at least one non-printable feature is larger than at least one printable feature. In certain embodiments, the test transmission image is aligned with the test reflection image. The method also involves constructing synthetic reference images from the test images, which in turn are used to construct reference simulation images from the synthetic reference images by applying the lithography system model. The synthetic reference images are constructed by removing defects from the test images, which in turn translates into the reference simulation images being free from the lithographically significant contamination defects. The method then proceeds with comparing the test simulation images to the reference simulation images in order to identify the lithographically significant defects. Applying the lithography system model allows to capture lithographic effects of non-printable features in corresponding test simulation images and reference simulation images. This inspection method may be practiced without using a reference die or a reference database, i.e., separate reference images provided from the reference die or the reference database.

In certain embodiments, a lithography system model includes one or more of the following parameters: numerical apertures of the lithographic system and/or inspection apparatus, wavelengths of the lithographic system and/or inspection apparatus, and illumination conditions of the lithographic system and/or inspection apparatus. In certain embodiments, an inspection method also involves providing a model of a photoresist system to be employed in the lithographic transfer and using this model to construct the test simulation images and the reference simulation images. The photoresist system model may include various resist forming process characteristics. In certain embodiments, a method may involve classification of the lithographically significant contamination defects.

In certain embodiments, reference simulation images include a reference simulation transmission image and a reference simulation reflection image, while test simulation images include a test simulation transmission image and a test simulation reflection image. In these embodiments, identification of the lithographically significant contamination defects may involve comparing the reference simulation transmission image to the test simulation transmission image and comparing the reference simulation reflection image to the test simulation reflection image.

In certain embodiments, constructing test simulation images involves constructing a band limited mask pattern that only includes linear terms. Such abbreviation of the mask pattern function can help to expedite inspection process. However, if additional accuracy is needed, a bank limited mask pattern may also include non-linear (quadratic) terms. Constructing test simulation images may involve separating printable from non-printable features based on optical intensity distributions of the band limited mask pattern. In certain embodiments, a method also involves constructing a geometrical map based on the band limited mask pattern for classifying geometrical features into the following categories: edges, corners, line ends, and other features. The geometrical map can be used to classify geometrical features while identifying the lithographically significant contamination defects. Furthermore, identification of lithographically significant contamination defects may involve applying different detection thresholds to at least two different geometrical feature types of the geometrical map.

In certain embodiments, a method also involves building a feature map based on the test simulation images. The feature map may include multiple image portions each having a corresponding Mask Error Enhancement Factor (MEEF). The MEEF may be then used to automatically adjust detection thresholds for each image portion, based on the corresponding MEEF values, e.g., during identification of the lithographically contamination significant defects. In certain embodiments, a process also involves providing a user-defined detection threshold for identifying the lithographically significant contamination defects.

In certain embodiments, provided is a system for inspecting a photomask to identify lithographically significant contamination defects that includes at least one memory and at least one processor that are configured to perform the following operations: producing test images of the photomask, constructing test simulation images by applying a lithography system model to the test images, constructing synthetic reference images from the test images by removing defects from the test images, constructing reference simulation images by applying the model of the lithography system to the synthetic reference images, and comparing the test simulation images to the reference simulation images to identify the lithographically significant contamination defects.

These and other aspects of the invention are described further below with reference to the figures.

DETAILED DESCRIPTION OF EXAMPLE EMBODIMENTS

Figure 1A:
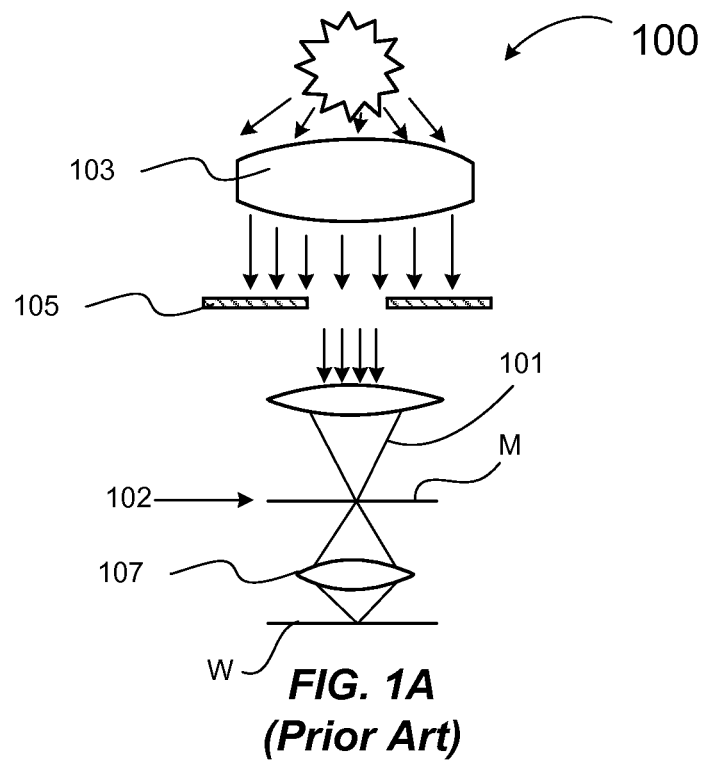
FIG. 1A is a simplified schematic representation of a lithographic system for transferring a mask pattern from a photomask onto a wafer in accordance with certain embodiments.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.
Introduction Novel methods and systems described herein are used for inspecting photomasks to identify lithographically significant contamination defects. Inspection involves capturing one or more test images of the inspected photomask and using these images to develop at least two separate sets of simulation images, one of which does not have lithographically significant defects and is used as a reference. The simulation images account for various characteristics of lithographic systems and, in certain embodiments, characteristics of photoresist materials. This model-based approach focuses on lithographically significant defects and ignores many other defects that are not printed during the photolithography process and are lithographically insignificant.

In certain specific embodiments, two or more test light intensity images of the inspected photomask are captured using a specifically configured inspection system. Multiple test images represent different optical characteristics of the photomask, e.g., transmission and reflection images or images taken at differing wavelengths. These images are then aligned and processed together to recover a "band limited mask pattern," which is a functional representation of the test images containing, in certain embodiments, only linear terms. A lithography system model containing various characteristics of a stepper and/or scanner is then applied to generate simulation test images, e.g. an aerial image or a photoresist image. In a parallel set of operations, the test images are processed to exclude any defects from the images. The resulting images are referred to as "synthetic" images. The lithographic system models is likewise applied to the synthetic images to the test images so as to generate synthetic simulation images, which in turn are compared to the test simulation images to obtain various defect information. In particular, due to application of the lithography system model to both test and reference images, this defect information pertains to lithographically significant defects.

An example of a photomask inspection system that does not require separate reference images to be obtained from a die-to-die or database is Starlight™ inspection system available from KLA Tencor in Milpitas, Calif. This system is designed to capture high resolution transmitted and reflected images of a photomask and to combine the two images to generate a synthetic reference mask image. This synthetic reference image is free of defects (e.g., a contamination signature) even if the actual photomask has defects. The synthetic reference mask image is then used to generate synthetic reference transmission and reflection images, which are compared to the captured test images to determine defects. While this system can be successfully used to identify various photomask defects, it is not designed to consider wafer printability defects or specifically focus on lithographically significant defects. In other words, this system does not account for effects of lithographic printing. As noted above, not all defects have impact on the resulting printed pattern and, therefore, some of these defects can and should be ignored. For example, a contamination defect in a flat-field Molybdenum-Silicon area has little or no printability wafer impact. Likewise, many OPC feature defects have no or very little lithographic significance. Yet, it is very hard and often impossible for an inspector to differentiate between lithographically significant and insignificant defects. Modern lithographic systems use advanced stepper illumination profiles and rely on partial coherence nature of the imaging behavior, which makes the inspector's manual differentiation among defects a very difficult task.

Novel methods and systems described herein automatically account for printability (or non-printability) characteristics provided in lithographic and/or photoresist system models. Furthermore, certain proposed inspection techniques do not require a separate reference image provided from a database or another die. In a production environment this offers significant advantage because separate reference images are typically not available. Finally, certain proposed methods allow for automatic mask error enhancement factors (MEEF) enhancement in regions with high MEEF. Some inventive aspects will be now further explained in the context of inspection systems and techniques.
Inspection System Examples FIG. 1A is a simplified schematic representation of a typical lithographic system 100 that can be used to transfer a mask pattern from a photomask M onto a wafer W in accordance with certain embodiments. Examples of such systems include scanners and steppers, more specifically one of the TWIN- SCAN systems available from ASML in Veldhoven, Netherlands (e.g., TWINSCAN NXT:1950i Step-and-Scan system). In general, an illumination source 103 directs a light beam through an illumination lens 105 onto a photomask M located in a mask plane 102. The illumination lens 105 has a numeric aperture 101 at that plane 102. The value of the numerical aperture 101 impacts which defects on the photomask are lithographic significant defects and which ones are not. A portion of the beam that passes through the photomask M forms a patterned optical signal that is directed through imaging optics 107 and onto a wafer W to initiate the pattern transfer.

Figure 1B:
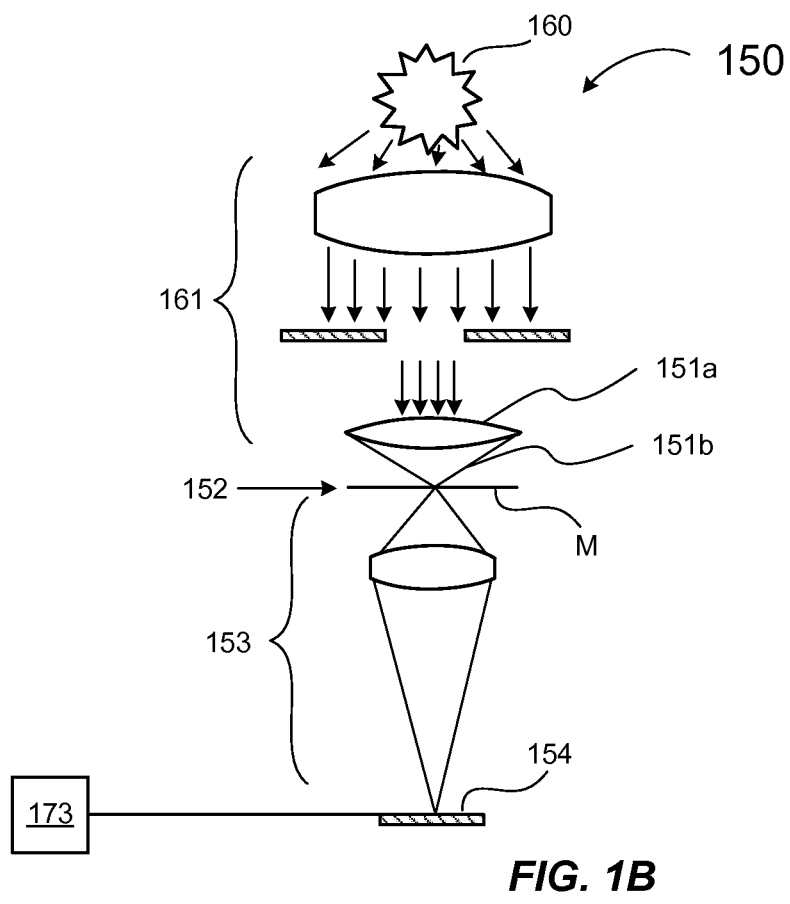
FIG. 1B provides a schematic representation of an photomask inspection apparatus in accordance with certain embodiments.

FIG. 1B provides a schematic representation of an inspection system 150 that has an imaging lens 151a with a relative large numerical aperture 151b at a reticle plane 152 in accordance with certain embodiments. The depicted inspection system 150 includes microscopic magnification optics 153 designed to provide, for example, 60-200× magnification for enhanced inspection. The numerical aperture 151b at the reticle plane 152 of the inspection system is often considerable greater than the numerical aperture 101 at the reticle plane 102 of the lithography system 100, which would result in differences between test inspection images and actual printed images. Each of these optical systems (100, 150) induces different optical effects in the produced images, which are accounted and compensated for in novel inspection techniques described herein.

Novel inspection techniques may be implemented on various specially configured inspection systems, such as the one schematically illustrated in FIG. 1B. The system 150 includes an illumination source 160 producing a light beam that is directed through illumination optics 161 onto a photomask M in the reticle plane 152. Examples of light sources include lasers or filtered lamps. In one example, the source is a 193 nm laser. As explained above, the inspection system 150 has a numerical aperture 151a at the reticle plane 152 that may be greater than a reticle plane numerical aperture (e.g., element 101 in FIG. 1A) of the corresponding lithography system. The photomask M to be inspected is placed at the reticle plane 152 and exposed to the source. The patterned image from the mask M is directed through a collection of magnification optical elements 153, which project the patterned image onto a sensor 154. Suitable sensors include charged coupled devices (CCD), CCD arrays, time delay integration (TDI) sensors, TDI sensor arrays, photomultiplier tubes (PMT), and other sensors. The signals captured by the sensor 154 can be processed by a computer system 173 or, more generally, by a signal processing device, which may include an analog-to-digital converter configured to convert analog signals from the sensor 154 into digital signals for processing. The computer system 173 may be configured to analyze intensity, phase, and/or other characteristics of the sensed light beam. The computer system 173 may be configured (e.g., with programming instructions) to provide a user interface (e.g., on a computer screen) for displaying resultant test images and other inspection characteristics. The computer system 173 may also include one or more input devices (e.g., a keyboard, mouse, and/or joystick) for providing user input, such as changing detection threshold. In certain embodiments, the computer system 173 is configured to carry out inspection techniques detailed below. The computer system 173 typically has one or more processors coupled to input/output ports, and one or more memories via appropriate buses or other communication mechanisms.

Because such information and program instructions may be implemented on a specially configured computer system, such a system includes program instructions/computer code for performing various operations described herein that can be stored on a computer readable media. Examples of machine-readable media include, but are not limited to, magnetic media such as hard disks, floppy disks, and magnetic tape; optical media such as CD-ROM disks; magneto-optical media such as optical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter. In certain embodiments, a system for inspecting a photomask includes at least one memory and at least one processor that are configured to perform the following operations: producing test images that include a test transmission image and a test reflection image, constructing test simulation images by applying a model of the lithography system to the test images, constructing synthetic reference images from the test images by removing defects from the test images, constructing reference simulation images of the synthetic reference images by applying the model of the lithography system to the synthetic reference images, and comparing the test simulation images to the reference simulation images to identify the lithographically significant defects. Examples of inspection systems include a specially configured TeraScan™ DUV inspection system and a specifically configured Teron 600 Series Reticle Defect Inspection system, both available from KLA-Tencor of Milpitas, Calif.

Inspecting Methods Examples

Figure 2:
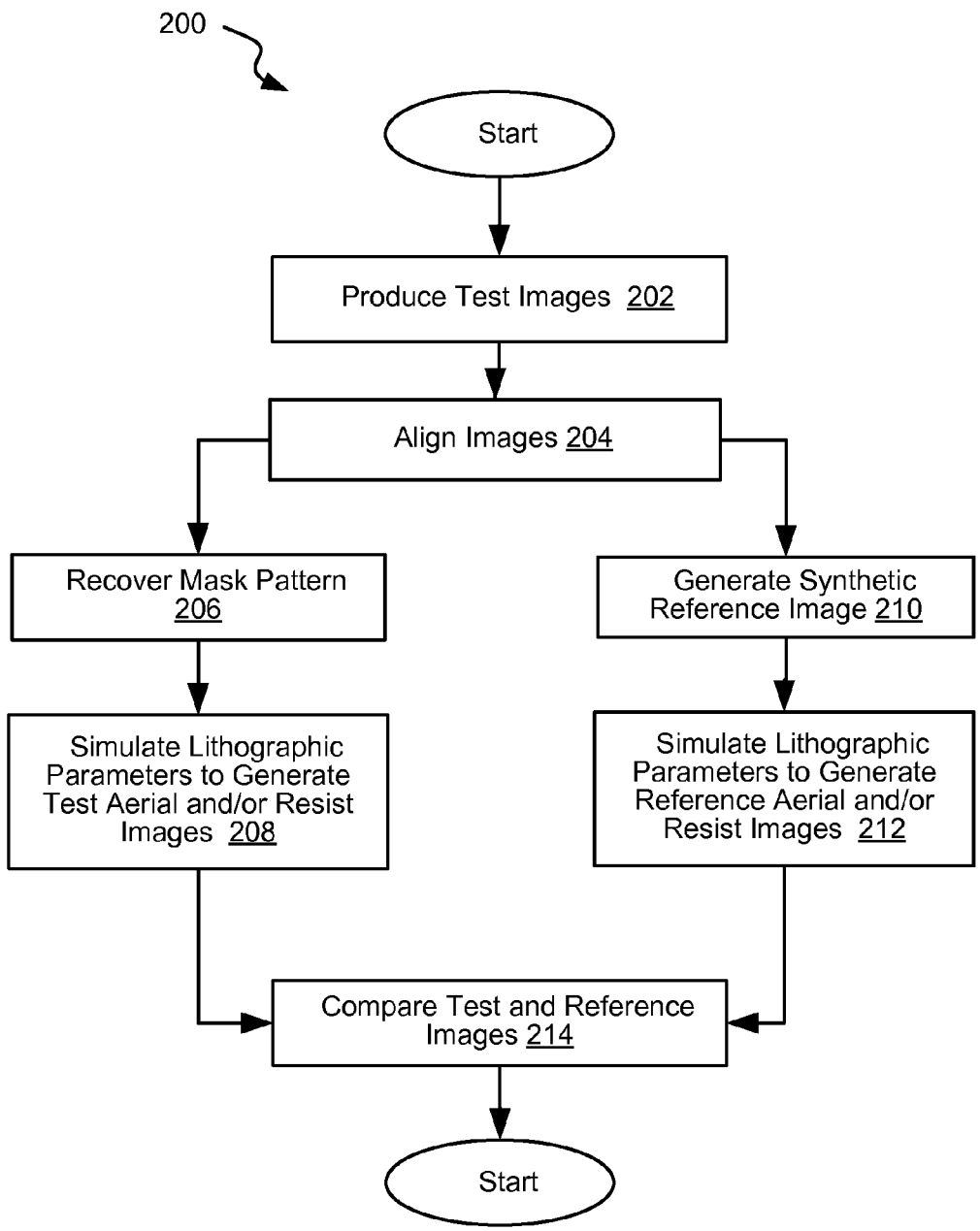
FIG. 2 illustrates a process flowchart corresponding to one example of a method for inspecting a photomask to identify lithographically significant contamination defects.

FIG. 2 illustrates a process flowchart corresponding to one example of a method for inspecting a photomask to identify lithographically significant defects. Various types of photomasks that include one or more printable features and one or more non-printable features may be inspected using this method. For example, a photomask made from a transparent fused silica blank with a pattern defined by a chrome metal adsorbing film can be used. In general, various semiconductor substrates, such as reticles, photomasks, semiconductor wafers, phase shift masks, and Embedded Phase Shift Masks (EPSMs), can be inspected using this method. As mentioned above, non-printable features may include various optical proximity correction (OPC) features that are used to compensate for imaging errors due to diffraction. One type of such features is sub-resolution assist features (SRAF). In certain embodiments, at least one non-printable feature is larger than at least one printable feature.

Once the photomask is provided for the inspection process, e.g., placed on an inspection stage of the inspection system, the process may proceed with producing one or more test images of the photomask at 202. For example, the photomask may be illuminated to capture two or more light intensity images at different illumination and/or collection conditions. In one specific embodiment, a transmission light intensity image and a reflection light intensity image are captured. In other embodiments, two or more reflection images or two or more transmission images are produced while the photomask is illuminated at different wavelengths. For example, if photomask materials cause transmission to be a strong function of an illumination light wavelength, then two different but closely spaced wavelengths could be used to generate a pair of transmitted images each sensing different transmission levels.

The captured test images are typically aligned in operation 204. This alignment may involve matching optical properties of the inspection system for multiple test images. For example, in the case of transmission and reflection images, some adjustment of the images can be made to compensate for differences in optical paths for two respective signals. Alignment adjustments may depend on specific geometries of an inspection system used.

Once aligned, the test images can be processed to recover a band limited mask amplitude function at 206. This function is sometimes also referred to as a band limited mask pattern. In one approach, partially coherent optical imaging can be modeled as a sum of two or more coherent systems, which is further explained in more detail in U.S. patent application Ser. No. 11/622,432, which is incorporated herein by reference for purposes of describing operation 206. Specifically, the Hopkins equations for partially coherent imaging can be used to form a Transmission-Cross-Coefficient (TCC) matrix. This matrix can be then decomposed into corresponding Eigen vectors, which act as kernels of coherent systems. The Eigen value weighted sum of the intensity contributions from each of these coherent systems yields the image intensity, which can be used to represent the intensity of the transmitted signal. In certain embodiments, reflected and transmitted intensities of the test images can be represented with only linear terms that are referred to as band limited mask amplitude functions. In certain embodiments, a band limited mask pattern also includes non-linear terns, in particular, where additional accuracy is needed. An example of this function is presented in Equation 1.

$$\frac{\|a_R\|^2(I_T(x, y) - \|c_T\|^2) - \|a_T\|^2(I_R(x, y) - \|c_R\|^2)}{2\|a_R\|^2 \text{Re}\left(a_T \overset{*}{C_T}\right) - 2\|a_T\|^2 \text{Re}(a_R c_R^*)} =$$ [Equation 1]

$$\sum \lambda_i D_i [P(x, y) \oplus E_i(x, y)] =$$

$$P(x, y) \oplus \sum_{i=0}^{N} \lambda_i D_i E_i(x, y) = M(x, y)$$

where $a_R$ is the complex reflected amplitude of the difference between the mask foreground tone and the background tone; $I_T(x,y)$ describes the transmitted intensity image of a mask using the inspection system; $c_T$ is the complex transmitted amplitude of the background tone of the mask (e.g., in a quartz and chrome binary mask $C_T$ can describe properties of the chromium pattern); $a_T$ is the complex transmitted amplitude of the difference between the mask foreground tone and the background tone (e.g., using the same mask as above $a_T$ can describe the optical properties of the difference between the quartz and the chromium; $c_T$ and $a_T$ of course vary depending on the properties of the material layers described); $I_R(x,y)$ describes the reflected intensity image of a mask using the inspection system; $C_R$ is the complex reflected amplitude of the background tone of the mask and $a_R$ is the complex reflected amplitude of the difference between the mask foreground tone and the background tone; Re (x) represents the real component of x; P(x,y) defines the mask pattern of the photomask being inspected; $E_i$ and $\lambda_i$ refer, respectively, to the Eigen Vectors and Eigen Values of associated elements of a transmission cross-coefficient (TCC) imaging matrix associated with the inspection tool; $D_i$ is the DC gain of $E_i$ and Re (x).

The band limited mask pattern M (x,y) is defined by the mask pattern P (x,y) convolved with a function: $\Sigma_{i=0}^{N}\lambda_i D_i E_i$ (x, y), which is referred to as a "recovery kernel". Therefore, the band limited mask pattern is a modified version of the mask pattern function P (x,y).

The band limited mask pattern is then used in operation 208 to generate test simulation images, such as test aerial images and/or test resist images. Lithographic and/or photoresist system models are provided for this purpose. A lithography system model may include numerical apertures of the lithographic and inspection systems, wavelengths used in lithographic and inspection systems, illumination conditions used in lithographic and inspection systems, and other lithographic and inspection parameters. For example, as further explained in U.S. patent application Ser. No. 11/622,432, basis kernels of the lithographic system model may be adjusted to back out any roll-off within the pass band of the lithographic system due to the band limited nature of the recovered mask pattern. A function ($F_i$ (x,y)) that defines a set of modified coherent bases is used to describe a modified TCC matrix for implementing the band limited mask pattern in the lithographic system model. A TCC matrix for the lithographic system may involve many terms. However, because most of the light intensity is represented in the first few terms, accurate estimates can be obtained using only those terms (e.g., the first ten or so terms). Thus, if desired, a truncated model can be employed that significantly reduces the computational burden. A user can obtain a desired degree of accuracy by taking as many terms in the series as are needed for each specific photomask inspection application. Overall, application of a lithography system model allows capturing lithographic effects of non-printable features in test simulation images.

In certain embodiments, constructing test simulation images involves separating non-printable features from printable features based on optical intensity distributions of the band limited mask pattern. A method may also involve constructing a geometrical map based on the band limited mask pattern for classifying geometrical features into one or more geometrical feature types, such as edges, corners, and line ends. Furthermore, a process of identifying the lithographically significant defects can be enhanced by applying different detection thresholds to different geometrical feature types of the geometrical map.

Lithographic and/or photoresist modeling substantially eliminates lithographically insignificant defects from the resulting simulation images. Such defects, also called "nuisance defects," have little or no effect on the printed pattern. For the purposes of this disclosure, lithographically significant defects are defined as those defects that have lithographic significance in the final printed pattern. That is to say, that some defects ("nuisance defects"), although present in the mask, have no significant impact on the printed pattern transferred to a photoresist layer. Examples include, defects so small (or on a lithographically insensitive portion of the pattern) as to be largely irrelevant. Also, a defect can be formed in a relatively defect insensitive portion of the substrate. In some cases a defect can be formed on an assist or OPC feature (or other resolution enhancement feature) but not affect the final printed pattern. Thus, a lithographically significant defect is a defect that is present on the mask and can cause a significant effect in the lithographically transferred pattern. Such lithographically significant defects can cause problems related to circuit failures, sub optimal performance, and so on.

In certain embodiments, an inspection process also includes building a feature map based on the test simulation images. The feature map may include multiple image portions each having a corresponding Mask Error Enhancement Factor (MEEF). For example, a typical photomask contains pre-corrected images of the final IC that are magnified by a factor of four. While this factor helps reduce pattern sensitivity to imaging errors, small size features of modern IC circuits (e.g., 22 nanometers and less) are negatively affected by light beam scattering during lithographic exposure. Therefore, MEEF sometimes exceeds one, e.g., dimension errors on a wafer exposed using a 4× photomask may be more than a quarter of the dimension error on the photomask. In certain embodiments, MEEF values captures in a feature map are used for automatic adjustment of detection thresholds for corresponding image areas. For example, areas with large MEEF values can be inspected more carefully than areas with lower MEEF values. This operation may be implemented in an automated mode. A process may also involve providing a user-defined detection threshold for identifying the lithographically significant defects.

As mentioned above, a separate reference image provided from a database or another die is often not available. An inspection process can include a series of parallel operations 210 and 212 for generating internal reference images from the test images, which can be used as inputs for aligned test images and recovered mask pattern. These images are sometimes referred to as synthetic images. Various algorithms for generating synthetic images may be used, for example, Starlight™ system available from KLA Tencor in Milpitas, Calif. This system is configured to sample various geometrical features on a photomask during calibration of the system and construct a database of transmitted and reflected properties of these features. Later, during inspection, when a tested photomask is scanned, the system constructs synthetic images based on information in the database. Similar techniques are described in U.S. Pat. No. 6,282,309 to Emery issued on Aug. 28, 2001, which is incorporated herein by reference in its entirety for purposes of describing synthetic imaging algorithms. For example, algorithms may be based on an assumption that transmitted and reflected signals (at the same inspection point) are always complementary to each other in the absence of defects.

In other words, the sum of the transmitted and reflected signals is invariant along the scan in the absence of defects. Therefore, any observed deviation in the summation signal can be interpreted as a defect and excluded from synthetic images.

Once synthetic reference images are generated in operation 210, these images are further processed to generate reference simulation images, such as a reference aerial image and/or a reference resist image at 212. Operation 212 is similar to operation 208 performed on test images described above. However, because synthetic reference images do not include defects, the corresponding reference simulation images are generated to be free from lithographically significant defects.

At 214, the test simulation images are compared to the reference simulation images to identify lithographically significant defects. In certain embodiments, the reference simulation images include a reference simulation transmission image and a reference simulation reflection image, while the test simulation images include a test simulation transmission image and a test simulation reflection image. In this embodiment, comparison is performed within the two groups, i.e. the reference simulation transmission image is compared to the test simulation transmission image, while the reference simulation reflection image is compared to the test simulation reflection image. In certain embodiments, identified lithographically significant defects are classified.

In certain embodiments, inspection is applied to multiple tone masks as well. One example of such masks are tri-tone masks having a darkest region (e.g., a chrome or opaque regions) and a quartz or lightest region with a pattern of grey scale regions having a darkness between the two. Such grey scale regions can be obtained in number of ways (e.g., using EPSM materials and so on). In this case, the mask is treated as two different masks that are separately analyzed. For example, a tri-tone mask can be treated using the same models as described above. However, the tri-tone mask can be treated as a mask having a background pattern (e.g., chromium) with the grey scale pattern (e.g., EPSM material) treated as the foreground. The images can be processed as above using the same equations and process operations. A second analysis is performed on the mask using the EPSM material as the background pattern and the lightest pattern (e.g., the quartz) treated as the foreground. Alignment can easily be effectuated because each of the materials have substantially differing properties that demonstrate different edge effects which can be used to align the images. The mask patterns can then be summed and then compared to references in die-to-die or die-to-database comparisons to verify wafer pattern correctness through out the process window and to identify lithographically significant defects.

Conclusion

Although the foregoing invention has been described in some detail for purposes of clarity of understanding, it will be apparent that certain changes and modifications may be practiced within the scope of the appended claims. It should be noted that there are many alternative ways of implementing the processes, systems and apparatus of the present invention. Accordingly, the present embodiments are to be considered as illustrative and not restrictive, and the invention is not to be limited to the details given herein.

What is claimed is:

1. A method for inspecting a photomask to identify lithographically significant contamination defects, the method comprising:
   providing the photomask comprising one or more printable features and one or more non-printable features, the photomask configured to achieve lithographic transfer of the one or more printable features onto a substrate using a lithography system;
   producing test images of the photomask using an inspection apparatus, the test images comprising a test transmission image and a test reflection image;
   providing a model of the lithography system to be employed in the lithographic transfer;
   constructing test simulation images by applying the model of the lithography system to the test images;
   constructing synthetic reference images from the test images by removing defects from the test images;
   constructing reference simulation images from the synthetic reference images by applying the model of the lithography system to the synthetic reference images, wherein the reference simulation images are constructed to be free of the lithographically contamination significant defects; and
   comparing the test simulation images to the reference simulation images to identify the lithographically significant contamination defects.

2. The method of claim 1, further comprising aligning the test transmission image with respect to the test reflection image.

3. The method of claim 1, further comprising:
   providing a model of a photoresist system to be employed in the lithographic transfer; and
   constructing the test simulation images and the reference simulation images by applying the model of the photoresist system in addition to applying the model of the lithography system.

4. The method of claim 3, wherein the model of the photoresist system comprises resist forming process characteristics.

5. The method of claim 1, wherein the lithographically significant contamination defects are identified without using a reference die or a reference database.

6. The method of claim 1, wherein the reference simulation images comprise a reference simulation transmission image and a reference simulation reflection image, and wherein the test simulation images comprise a test simulation transmission image and a test simulation reflection image.

7. The method of claim 6, wherein comparing the test simulation images to the reference simulation images comprises:
comparing the reference simulation transmission image to the test simulation transmission image; and
comparing the reference simulation reflection image to the test simulation reflection image.

8. The method of claim 1, further comprising classifying the lithographically significant contamination defects.

9. The method of claim 1, wherein the one or more non-printable features comprise sub-resolution assist features (SRAF).

10. The method of claim 1, wherein lithographic effects of the one or more non-printable features are captured in the test simulation images and the reference simulation images.

11. The method of claim 1, wherein at least one of the non-printable features is larger than at least one of the printable features.

12. The method of claim 1, wherein constructing the test simulation images comprises constructing a band limited mask pattern comprising only linear terms.

13. The method of claim 12, wherein constructing the test simulation images comprises separating the one or more non-printable features from the one or more printable features based on optical intensity distributions of the band limited mask pattern.

14. The method of claim 12, further comprising constructing a geometrical map based on the band limited mask pattern for classifying geometrical features into one or more geometrical feature types selected from the group consisting of edges, corners, and line ends.

15. The method of claim 14, further comprising using the geometrical map to classify the geometrical features while identifying the lithographically significant contamination defects.

16. The method of claim 14, wherein identifying the lithographically significant contamination defects comprises applying different detection thresholds to at least two different geometrical feature types of the geometrical map.

17. The method of claim 1, further comprising building a feature map based on the test simulation images, wherein the feature map comprises multiple image portions each having a corresponding Mask Error Enhancement Factor (MEEF).

18. The method of claim 17, further comprising, during identifying the lithographically significant contamination defects, automatically adjusting detection thresholds for each image portion of the multiple image portions based on the corresponding MEEFs.

19. The method of claim 1, further comprising providing a user-defined detection threshold for identifying the lithographically significant contamination defects.

20. The method of claim 1, wherein the model of the lithography system comprises at least one the following parameters: numerical apertures of the lithographic system and the inspection apparatus, wavelengths of the lithographic system and the inspection apparatus, and illumination conditions of the lithographic system and the inspection apparatus.

21. A system for inspecting a photomask having one or more printable features and one or more non-printable features to identify lithographically significant contamination defects comprising at least one memory and at least one processor that are configured to perform the following operations:
producing test images of the photomask, the test images comprising a test transmission image and a test reflection image;
constructing test simulation images by applying a model of a lithography system to the test images;
constructing synthetic reference images from the test images by removing defects from the test images;
constructing reference simulation images from the synthetic reference images by applying the model of the lithography system to the synthetic reference images, wherein the reference simulation images are free from the lithographically significant contamination defects; and
comparing the test simulation images to the reference simulation images to identify the lithographically significant contamination defects.

* * * * *